United States Patent
Choi et al.

(10) Patent No.: US 9,631,271 B2
(45) Date of Patent: Apr. 25, 2017

(54) SPUTTERING SYSTEM AND METHOD OF FABRICATING DISPLAY DEVICE USING THE SAME

(71) Applicant: Samsung Display Co., Ltd., Yongin (KR)

(72) Inventors: Seung-Ho Choi, Yongin (KR); Jong-Jin Park, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 123 days.

(21) Appl. No.: 14/218,583

(22) Filed: Mar. 18, 2014

(65) Prior Publication Data

US 2015/0027876 A1 Jan. 29, 2015

(30) Foreign Application Priority Data

Jul. 25, 2013 (KR) ........................ 10-2013-0088268

(51) Int. Cl.
| | | |
|---|---|---|
| *C23C 14/00* | (2006.01) | |
| *C25B 11/00* | (2006.01) | |
| *C25B 13/00* | (2006.01) | |
| *C23C 14/35* | (2006.01) | |
| *H01J 37/34* | (2006.01) | |

(52) U.S. Cl.
CPC .......... *C23C 14/352* (2013.01); *H01J 37/345* (2013.01); *H01J 37/3417* (2013.01); *H01J 37/3429* (2013.01); *H01J 37/3452* (2013.01)

(58) Field of Classification Search
CPC ..... H01J 37/342; H01J 37/345; H01J 37/3452
See application file for complete search history.

(56) References Cited

U.S. PATENT DOCUMENTS

| | | | |
|---|---|---|---|
| 5,558,749 | A | 9/1996 | Yokoyama et al. |
| 6,365,010 | B1 * | 4/2002 | Hollars ................... C23C 14/35 |
| | | | 204/192.12 |
| 2006/0289304 | A1 * | 12/2006 | Mayer ................. C23C 14/3407 |
| | | | 204/298.12 |
| 2012/0175251 | A1 * | 7/2012 | Crowley ................. C23C 14/35 |
| | | | 204/298.16 |

FOREIGN PATENT DOCUMENTS

| | | |
|---|---|---|
| JP | 2009-293089 | 12/2009 |
| KR | 10-1996-0005771 | 2/1996 |
| KR | 10-2012-0049554 | 5/2012 |

* cited by examiner

*Primary Examiner* — Ibrahime A Abraham
(74) *Attorney, Agent, or Firm* — H.C. Park & Associates, PLC

(57) ABSTRACT

A sputtering system includes a chamber, a plurality of targets, and a substrate holder. The targets are disposed in the chamber. Each target includes a magnet unit disposed therein. The substrate holder is configured to support a substrate in the chamber. The magnet units are configured to generate a magnetic field between the targets. Each of the magnet units includes magnets disposed in two rows.

8 Claims, 4 Drawing Sheets

SPUTTERING SYSTEM AND METHOD OF FABRICATING DISPLAY DEVICE USING THE SAME

CROSS-REFERENCE TO RELATED APPLICATION

This application claims priority from and the benefit of Korean Patent Application No. 10-2013-0088268, filed on Jul. 25, 2013, which is incorporated by reference for all purposes as if set forth herein.

BACKGROUND

Field

Exemplary embodiments relate to a sputtering system configured to perform a sputtering process and a method of fabricating a display device using the same.

Discussion

Conventional organic light-emitting display devices, which typically include one or more thin film transistors (TFTs), may be utilized in various electronic devices, such as, for example, digital cameras, video cameras, camcorders, personal digital assistants, portable information terminals, notebooks, smart phones, tablets, flexible display devices, workstations, televisions, etc., as well as in any other suitable product, such as, for instance, automobiles, consumer appliances, billboards, signs, etc. These organic light-emitting display devices may include first and second electrodes that may be formed on a surface of an underlying substrate and an intermediate layer, which may include an organic light emitting layer, which may be disposed between the first and second electrodes. It is noted that a thin film encapsulation (TFE) layer may be utilized to protect the intermediate layer formed on the substrate. The TFE may be formed utilizing any suitable process, such as, for example, a thin film deposition process (e.g., a chemical vapor deposition (CVD) process, a physical vapor deposition (PVD) process, and/or the like). A PVD process typically includes a sputtering process, a thermal evaporation process, an electron-beam evaporation process, and/or the like.

Among the aforementioned processes, the sputtering process may be utilized to form the TFE layer regardless of a material of the underlying substrate. Conventional sputtering systems typically include a magnet that may be disposed at least partially about a target to increase sputtering efficiency. That is, the magnet may be coupled about the target to form at least one magnetic field perpendicular to one or more other electric fields to restrict movement of electrons in the surrounding environment of the target, as well as extend a moving path of the electrons. As previously noted, this may increase sputtering efficiency. It is noted, however, that non-discharge may occur in an undesired region (i.e., not a normal discharge region) due, at least in part, to the structure of the magnet. This may cause non-uniformity in erosion of the target and a reduction in occurrence of arcs, and, thereby, the density of plasma arcs.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments relate to a sputtering system configured to prevent abnormal discharge and perform a more stable sputtering process, as well as a method of fabricating a display device using the same.

Additional aspects will be set forth in the detailed description which follows, and, in part, will be apparent from the disclosure, or may be learned by practice of the inventive concept.

According to exemplary embodiments, a sputtering system includes a chamber; a plurality of targets, and a substrate holder. The targets are disposed in the chamber. Each target includes a magnet unit disposed therein. The substrate holder is configured to support a substrate in the chamber. The magnet units are configured to generate a magnetic field between the targets. Each of the magnet units includes magnets disposed in two rows.

According to exemplary embodiments, a method includes: causing, at least in part, sputtering targets disposed in a chamber to be electrically biased, each of the sputtering targets respectively housing magnets spaced apart from one another, the magnets being configured to generate a magnetic field between the sputtering targets; and causing, at least in part, particles to collide with the biased sputtering targets, the collisions causing deposition particles to be ejected from the biased sputtering targets. The magnetic field restricts a first portion of the deposition particles in a space between the biased sputtering targets and permits a second portion of the deposition particles to be deposited on a substrate disposed in the chamber.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
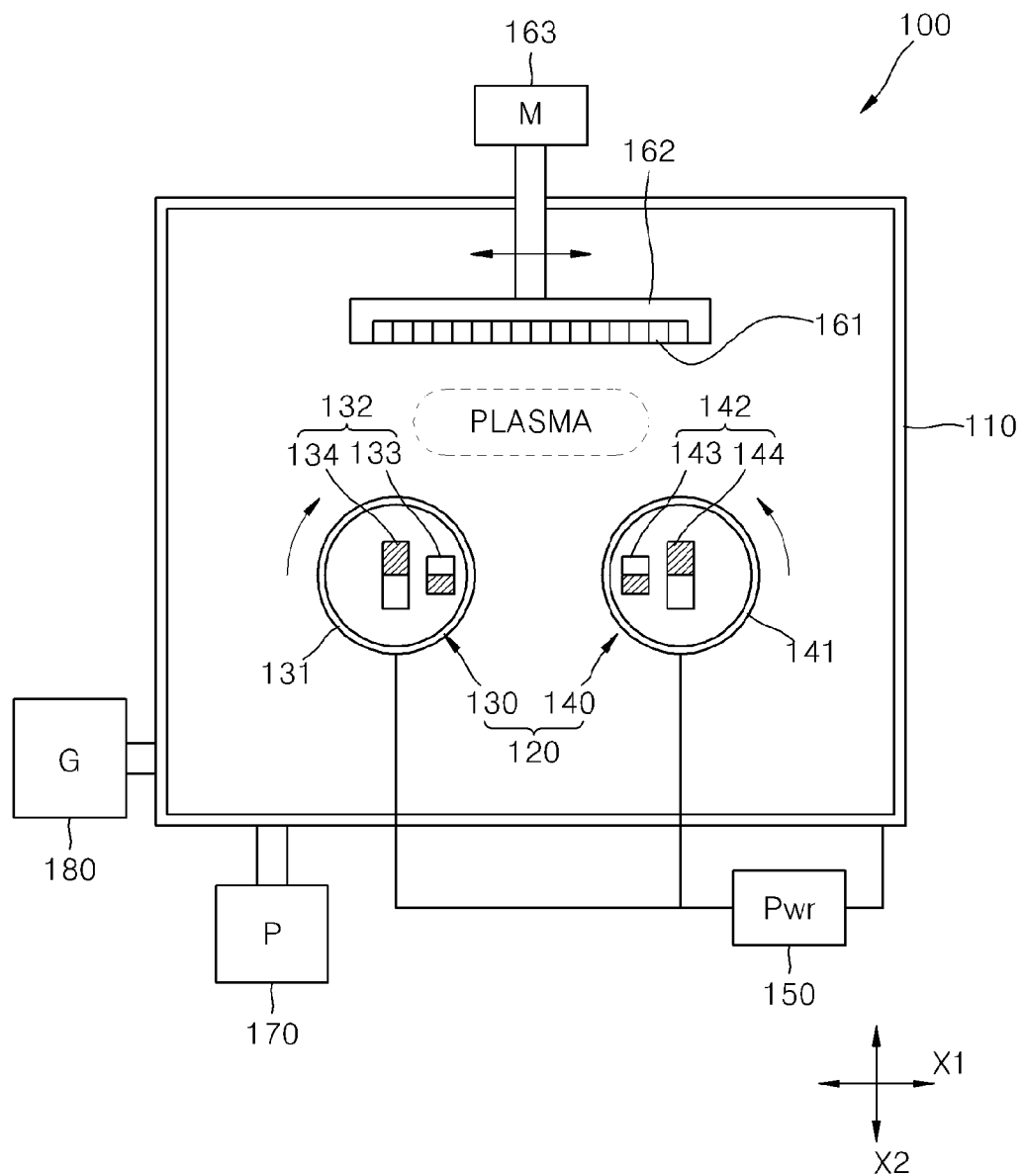
FIG. 1 is a schematic view of a sputtering system, according to exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
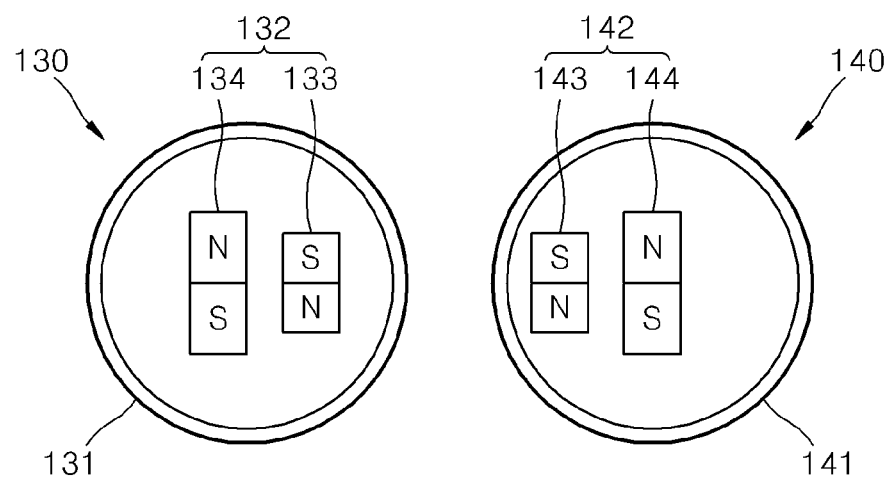
FIG. 2 is a cross-sectional view of the sputtering system of FIG. 1 including first and second sputtering evaporation sources disposed in a first state, according to exemplary embodiments.
Figure 3:
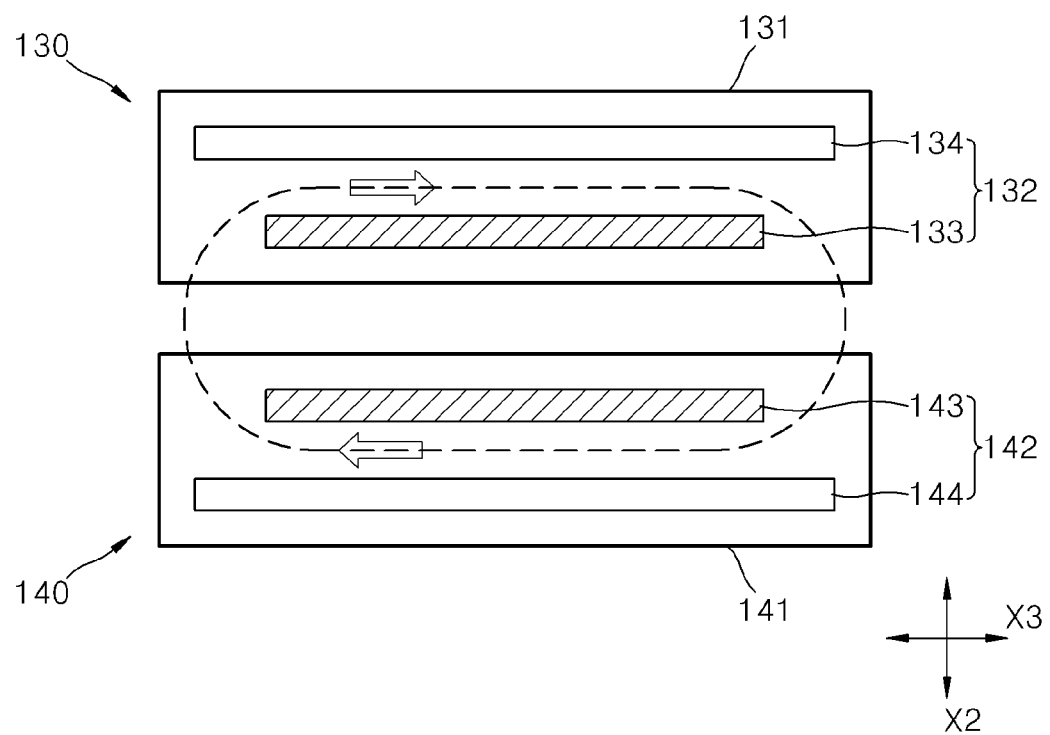
FIG. 3 is a cross-sectional view of the sputtering system of FIG. 2, according to exemplary embodiments.

FIG. 1 is a schematic view of a sputtering system 100, according to exemplary embodiments. FIG. 2 is a cross-sectional view of sputtering system 100 including first and second sputtering evaporation sources 130 and 140 disposed in a first state. FIG. 3 is a cross-sectional view of sputtering system 100 as illustrated in FIG. 2.

Referring to FIGS. 1 to 3, the sputtering system 100 includes a chamber 110 providing a deposition space (or environment). The chamber 110 may be pressurized, e.g., configured provide a negative pressure (e.g., vacuum) or positive pressure atmosphere, so as to promote stable deposition of a material.

A pair of sputtering evaporation sources 120 may be disposed in the chamber 110; however, it is noted that any suitable number of sputtering evaporation sources may be utilized in association with exemplary embodiments described herein. As seen in FIG. 1, however, the pair of sputtering evaporation sources 120 includes a first sputtering evaporation source 130 and a second sputtering evaporation source 140 facing the first sputtering evaporation source 130.

According to exemplary embodiments, the first sputtering evaporation source 130 may include a first target 131 and a first magnet unit 132 disposed in the first target 131. The first target 131 may have a cylindrical shape; however, it is contemplated that any other suitable geometric configuration may be utilized. The first magnet unit 132 may include a first magnet 133 and a second magnet 134 disposed adjacent to the first magnet 133. It is contemplated, however, that any suitable number of magnets may be utilized. The first and second magnets 133 and 134 may be arranged in a row configuration. It is noted that a permanent magnet or electromagnet may be used as the first magnet unit 132. It is also noted that the first and second magnets 133 and 134 may be disposed in, for example, two rows. In other words, the first and second magnets 133 and 134 may be spaced apart from one another.

In exemplary embodiments, the second sputtering evaporation source 140 may include a second target 141 and a second magnet unit 142 disposed in the second target 141. The second target 141 may have a cylindrical shape; however, any other suitable geometric configuration may be utilized. To this end, geometric configurations of the first and second magnet units 132 and 142 may be similar or different. Further, the second target 141 may include a central axis disposed parallel (or substantially parallel) to a first direction (e.g., a horizontal (or lateral) direction) X1 of the chamber 110, which may be parallel (or substantially parallel) to a central axis of the first target 131. The second magnet unit 142 may include a third magnet 143 and a fourth magnet 144 disposed adjacent to the third magnet 143. It is contemplated, however, that any suitable number of magnets may be utilized. The third and fourth magnets 143 and 144 may be arranged in a row configuration, e.g., the third and fourth magnets 143 and 144 may be arranged in two rows spaced apart from one another. It is noted that a permanent magnet or electromagnet may be used as the second magnet unit 142.

Although not illustrated, each of the first and second targets 131 and 141 may be supported in the chamber 110 by one or more target holders. In this manner, the first target 131 and the second target 141 may be manipulated (e.g., rotated and/or translated in or about one or more directions) via the target holders. For example, the first target 131 and the second target 141 may be rotated in opposite directions by one or more target rotation devices (not shown) coupled to the target holder(s). That is, when the first target 131 is rotated in a clockwise direction, the second target 141 may be rotated in a counterclockwise direction, or vice versa. It is noted, however, that exemplary embodiments may include other rotational and/or translational directions of the first and second targets 131 and 141.

In exemplary embodiments, angle adjustment devices configured to rotate the first and second magnet units 132 and 142 to a determined angle or a yoke to concentrate magnetic fields of the first and second magnet units 132 and 142 may be disposed in the first and second targets 131 and 141. It is noted, however, that any other suitable location/device may be utilized to detect and control the rotational/translational position of the first and second magnet units 132 and 142. That is, various devices/positions may be combined or utilized with the first and second targets 131 and 141 to detect and control the arrangement of the first and second targets 131 and 141.

A power source unit 150 to supply power may be connected to the first and second sputtering evaporation sources 130 and 140. The power source unit 150 may apply direct current (DC) power; however, it is also contemplated that alternating current (AC) power may be utilized. A first electrode (not shown), e.g., an anode, may be connected to the chamber 110, and a second electrode (not illustrated), e.g., a cathode, which may have a polarity different from that of the first electrode, may be connected to the first and second targets 131 and 141 that are respectively disposed in the first and second sputtering evaporation sources 130 and 140. It is noted that a single power source unit 150 may be utilized so that a discharge electrode may be distributed and then provided to the first and second sputtering evaporation sources 130 and 140, however, a plurality of power source units 150 may be utilized so that a plurality of discharge electrodes may be respectively provided to the first and second sputtering evaporation sources 130 and 140. In exemplary embodiments, however, power may be supplied to the first and second sputtering evaporation sources 130 and 140 in any suitable manner.

According to exemplary embodiments, a substrate 161, on which thin film deposition particles sputtering from the first and second targets 131 and 141 may be deposited, may be disposed in the chamber 110. For instance, the substrate 161 may be disposed in a direction X2, which may be perpendicular to the first direction X1. It is noted that the substrate 161 may be disposed in any suitable portion of the chamber 110, such as, for example, an upper portion of the chamber 110. In this manner, and the first and second targets 131 and 141 may be disposed in another portion of the chamber 110, such as, for instance, under the substrate 161 in a lower portion of the chamber 110. It is contemplated, however, that any other suitable positions for the substrate 110 and the first and second targets 131 and 141 may be utilized in association with exemplary embodiments described herein. For example, any arrangement in which the substrate 161 is spaced apart from the first and second targets 131 and 141 may be utilized in accordance with exemplary embodiments.

As seen in FIG. 1, the substrate 161 may be mounted on (or otherwise coupled to) a substrate holder 162. The substrate 161 may be detachably disposed on the substrate holder 162. The substrate holder 162, on which the substrate 161 may be mounted, may be configured to be variably adjusted, e.g., translated, rotated, etc. For example, the substrate holder 162 may be configured to horizontally translate along the first direction X1 based on a driving force provided by, for instance, a driving motor 163.

A pump 170 may be coupled to the chamber 110 to pressurize an internal environment of the chamber 110. For instance, the pump 170 may be utilized to form a vacuum state in the chamber 110. A gas supply unit 180 may be utilized to supply gas into the chamber 110, and, thereby, may be connected to the chamber 110. Any suitable sputtering gas, such as, for instance, argon (Ar), or any suitable reactive gas, such as, for example, oxygen ($O_2$), may be supplied to the chamber 110 by the gas supply unit 180.

According to exemplary embodiments, the sputtering system 100 may be structured such that plasma discharge and erosion regions in an undesired region are prevented (or otherwise reduced) based on the configuration and arrangement of the first and second sputtering evaporation sources 130 and 140. This will be described in more detail in the proceeding paragraphs.

In exemplary embodiments, the central axis of the first target 131 and the central axis of the second target 141 may be disposed substantially parallel to each other in the first direction X1 of the chamber 110. The first magnet unit 132 may be disposed in the first target 131. The second magnet unit 142 may be disposed in the second target 141. In this manner, the first and second magnet units 132 and 142 may be positioned to form magnetic fields outside the first and second targets 131 and 141, respectively. To this end, the first and second magnet units 132 and 142 may longitudinally extend in a third direction (e.g., a longitudinal direction) X3 of the first and second targets 131 and 141. With respect to FIG. 1, the third direction may extend into/out of the page X3, and, thereby, may be perpendicular (or substantially perpendicular) to one or more of the first and second directions X1 and X2. The third direction is illustrated in FIG. 3. It is noted that the respective positions of the first and second magnet units 132 and 142 may be fixed. To this end, the first and second targets 131 and 141 may be respectively rotatable about the first and second magnet units 132 and 142.

As previously mentioned, the first magnet unit 132 may include a plurality of magnets, e.g., the first magnet 133 and the second magnet 134 disposed adjacent to the first magnet 133. To this end, the second magnet unit 142 may include a plurality of magnets, e.g., the third magnet 143 and the fourth magnet 144 disposed adjacent to the third magnet 143. The first magnet unit 132 may face the second magnet unit 142 so that the sputtering process may be performed in a floating state of the substrate 161.

According to exemplary embodiments, the first and second magnets 133 and 134 disposed in the first target 131 and the third and fourth magnets 143 and 144 disposed in the second target 141 may be arranged in a north|south-south|north (NS-SN) arrangement, as seen in FIG. 2. In this manner, the first magnet 133 may be disposed closer to the second target 141 than the second magnet 134, and the third magnet 143 may be disposed closer to the first target 131 than the fourth magnet 144. To this end, the second and fourth magnets 134 and 144 may be arranged with the same polar directions, e.g., north|south. Likewise, the first and third magnets 133 and 143 may be arranged with the same polar directions, e.g., south|north. In other words, the second and fourth magnets 134 and 144 may be arranged with the same polarity arranged in the same direction, but the polarities of the second and fourth magnets 134 and 144 may be arranged in a direction different from (e.g., opposite to) the arrangement of polarities of the first and third magnets 133 and 144.

Alternatively, the first and second magnet units 132 and 142 may be symmetrically arranged with respect to a center line extending therebetween. As such, the first and second magnets 133 and 134 disposed in the first target 131 may have a south|north (SN) arrangement, and the third and fourth magnets 143 and 144 disposed in the second target 141 may have a north|south (NS) arrangement.

According to exemplary embodiments, the first and second targets 131 and 141 may have the same electric potential. When the first and second targets 131 and 141 have the same electric potential, as shown in a dashed oval shape of FIG. 3, the first and second targets 131 and 141 may form a closed loop to perform a discharging action. In this manner, the first and second targets 131 and 142 may act (or otherwise operate) like one target. To obtain the aforementioned discharging action, each of the first and third magnets 133 and 143 may have a length shorter than the respective lengths of each of the second and fourth magnets 134 and 144. It is also noted that the second and fourth magnets 134 and 144 may be disposed "outside of" the first and second magnets 133 and 143, such that the first and second magnets 133 and 143 may be disposed between the second and fourth magnets 134 and 144. It is noted that the first and third magnets 133 and 143 may have the same (or substantially the same) first length, and the second and fourth magnets 134 and 144 may have the same (or substantially the same) second length.

Although not illustrated, one or more controllers may be utilized to control one or more aspects or components of the sputtering system 100, such as, one or more of the power source unit 150, the driving motor 163, the pump 170, the gas supply unit 180, the target rotation devices, etc. The one or more controllers and/or one or more components of the various components of the sputtering system 100 may be implemented via one or more general purpose and/or special purpose components, such as one or more discrete circuits, digital signal processing chips, integrated circuits, application specific integrated circuits, microprocessors, processors, programmable arrays, field programmable arrays, instruction set processors, and/or the like. As such, the features, functions, processes, etc., described herein may be implemented via software, hardware (e.g., general processor, digital signal processing (DSP) chip, an application specific integrated circuit (ASIC), field programmable gate arrays (FPGAs), etc.), firmware, or a combination thereof. In this manner, the one or more controllers or one or more components of the sputtering system 100 may include or otherwise be associated with one or more memories (not shown) including code (e.g., instructions) configured to cause the one or more controllers and/or component(s) of the sputtering system 100 to perform one or more of the features, functions, processes, etc., described herein.

The memories may be any medium that participates in providing code/instructions to the one or more software, hardware, and/or firmware components for execution. Such memories may take many forms, including but not limited to non-volatile media, volatile media, and transmission media. Non-volatile media include, for example, optical or magnetic disks. Volatile media include dynamic memory. Transmission media include coaxial cables, copper wire and fiber optics. Transmission media can also take the form of acoustic, optical, or electromagnetic waves. Common forms of computer-readable media include, for example, a floppy disk, a flexible disk, hard disk, magnetic tape, any other magnetic medium, a compact disk-read only memory (CD-ROM), a rewriteable compact disk (CDRW), a digital video disk (DVD), a rewriteable DVD (DVD-RW), any other optical medium, punch cards, paper tape, optical mark sheets, any other physical medium with patterns of holes or other optically recognizable indicia, a random-access memory (RAM), a programmable read only memory (PROM), and erasable programmable read only memory (EPROM), a FLASH-EPROM, any other memory chip or cartridge, a carrier wave, or any other medium from which information may be read by, for example, a controller/processor.

A process of depositing a thin film using the sputtering system 100 is described in association with FIGS. 1 to 3.

The substrate 161 may be mounted on the substrate holder 162. The substrate holder 162 may be horizontally movable based on a driving force of the driving motor 163. The chamber 110 may be pressurized (e.g., placed in a vacuum state) using the vacuum pump 170.

The first and second targets 131 and 141 may be respectively rotated. It is noted that each of the first and second targets 131 and 141 may have a cylindrical shape. Also, the first target 131 may be rotated in a first direction (e.g., a clockwise direction) and the second target 141 may be rotated in a second direction (e.g., a counterclockwise direction) different from the first direction. Gas may be supplied into the chamber 110 via the gas supply unit 180 while the first and second targets 131 and 141 are being rotated.

According to exemplary embodiments, a negative voltage may be applied to the first and second targets 131 and 141 via the power source unit 150, which may induce glow discharge of the sputtering gas. Plasma generated by the glow discharge may be concentrated between the first and second targets 131 and 141 by magnetic fields generated by the first and second magnet units 132 and 142.

In exemplary embodiments, the first and second targets 131 and 141 may sputter positive ions of the plasma, which may discharge thin film deposition particles in a vapor phase into the chamber environment. Particles with relatively high energy levels, such as electrons, may be restricted in a space between the first and second targets 131 and 141. As such, the particles with the relatively high energy levels may not have an influence on the substrate 161 disposed facing the first and second sputtering evaporation sources 130 and 140. In this manner, the thin film deposition particles having relatively low energy levels may be diffused, and, thereby, deposited on the substrate 161.

The sputtering system 100, according to exemplary embodiments, may generate magnetic fields between the first and second targets 131 and 141 based on the arrangement, configuration, and electrical potential of the first and second magnet units 132 and 142. In this manner, the sputtering system 100 may restrict particles having relatively high energy levels, such as electrons, between the first and second targets 131 and 141, which thereby reduces damage to the substrate 161 that may be disposed perpendicular to an arrangement direction of the first and second targets 131 and 141. To this end, particles having relatively lower energy levels may be deposited on various substrates in a stable manner.

According to exemplary embodiments, the first and second magnets 133 and 134 have an NS arrangement in the first target 131, and the third and fourth magnets 143 and 144 disposed in the second target 141 have a south|north (SN) arrangement. As such, the first and second targets 131 and 141 may have the same electric potential to form a closed loop and perform a discharging action, and, thereby, operate like a single target. Thus, abnormal discharge due to additional magnetic fields generated from side surfaces of the first and second targets 131 and 141 may be prevented (or otherwise reduced) to obtain stable discharge effects.

In exemplary embodiments, the sputtering system 100 includes the first and second targets 131 and 141, which have respective cylindrical shapes that may be rotated during the sputtering. This rotating action enables the sputtering to occur uniformly over an entire area of the first and second targets 131 and 141 versus in concentrated areas thereof.

Figure 4:
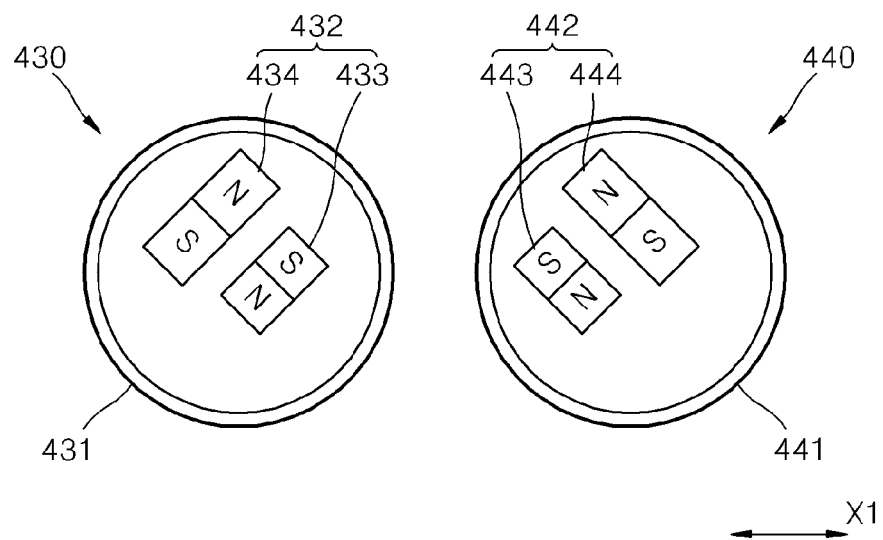
FIG. 4 is a cross-sectional view of a sputtering system including first and second sputtering evaporation sources disposed in a second state, according to exemplary embodiments.
Figure 5:
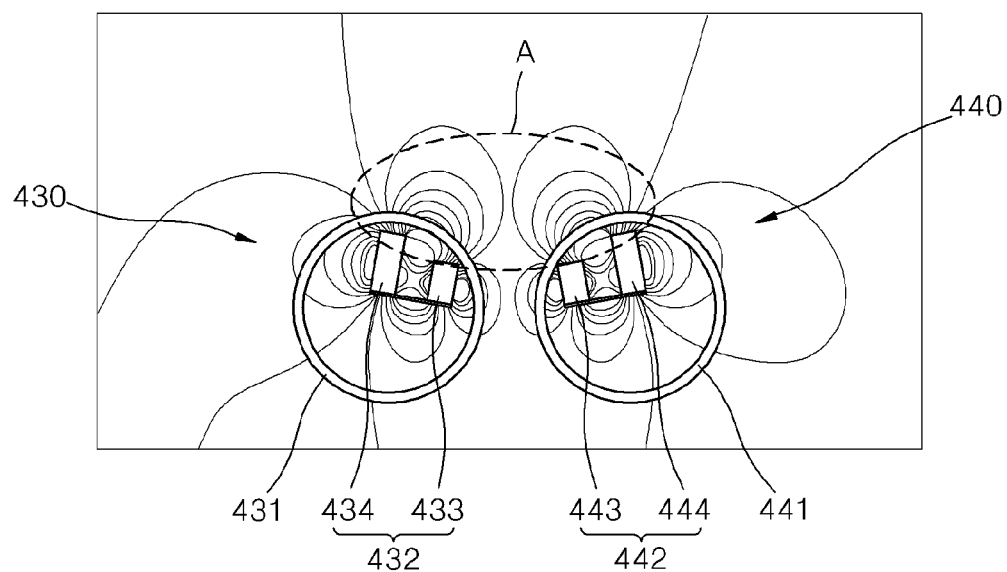
FIG. 5 is an illustration of the distribution of magnetic fields in the sputtering system of FIG. 4, according to exemplary embodiments.

FIG. 4 is a cross-sectional view of a sputtering system including first and second sputtering evaporation sources 430 and 440 disposed in a second state, according to exemplary embodiments. FIG. 5 is an illustration of the distribution of magnetic fields in sputtering system of FIG. 4. The sputtering system of FIG. 4 is substantially similar to the sputtering system 100 of FIG. 1 sans the configuration of the first and second sputtering evaporation sources 430 and 440. As such, duplicative descriptions are omitted and primarily differences are provided below to avoid obscuring exemplary embodiments described herein.

Referring to FIGS. 4 and 5, the first sputtering evaporation source 430 may include a first target 431 and a first magnet unit 432 disposed in the first target 431. The first magnet unit 432 may include a first magnet 433 and a second magnet 434; however, it is contemplated that any suitable number of magnets may be utilized. The second sputtering evaporation source 440 may be disposed substantially parallel to the first sputtering evaporation source 430, but may be spaced apart from the first sputtering evaporation source 430 in the first direction X1. The second sputtering evaporation source 440 may include a second target 441 and a second magnet unit 442 disposed in the second target 441. The second magnet unit 442 may include a third magnet 443 and a fourth magnet 444; however, it is contemplated that any suitable number of magnets may be utilized.

According to exemplary embodiments, the first and second magnets 433 and 434 disposed in the first target 431 and the third and fourth magnets 443 and 444 disposed in the second target 441 may be arranged in a north|south-south-|north (NS-SN) arrangement. The first and third magnets 433 and 443 may have a length that is relatively shorter than the lengths of the second and fourth magnets 434 and 444, respectively. Further, the first magnet 433 may have the same (or substantially the same) length as the third magnet 443, and the second magnet 434 may have the same (or substantially the same) length as the fourth magnet 444.

As seen in FIGS. 4 and 5, each of the first and second magnet units 432 and 434 may be tilted at a first angle and the third and fourth magnets 443 and 444 may be tiled at a second angle. That is, the first to fourth magnets 433, 434, 443, and 444 may be tilted from respective central axes of the first and second targets 431 and 441, e.g., in respective tilt directions such that the first and second magnets 433 and 434 are tilted towards the third and fourth magnets 443 and 444 and the second and fourth magnets 443 and 444 are tilted towards the first and second magnets 433 and 434. This arrangement may improve the magnet effects of the first through fourth magnets 433, 434, 443, and 444. That is, the first and second magnet units 432 and 442 may be tilted at an angle to generate strong magnetic fields in the first direction X1 on surfaces of the first and second targets 431 and 441, as shown in FIG. 5 as a dashed line A. This may improve sputtering efficiency.

According to exemplary embodiments, the first and second targets 431 and 441 may have the same electric potential, and, thereby, may form a closed loop. In this manner, the first and second targets 431 and 441 may operate as one target. To this end, during discharging, the horizontal magnetic fields generated in outer regions of the first and second magnet units 432 and 442 may be removed. Further, abnormal discharge due, at least in part, to additional magnetic fields may be prevented (or otherwise reduced. It is noted that the first and second magnet units 432 and 442 may be disposed at any suitable angles to adjust a rate of thin film deposition/formation with respect to a substrate, such as substrate 161.

Figure 6:
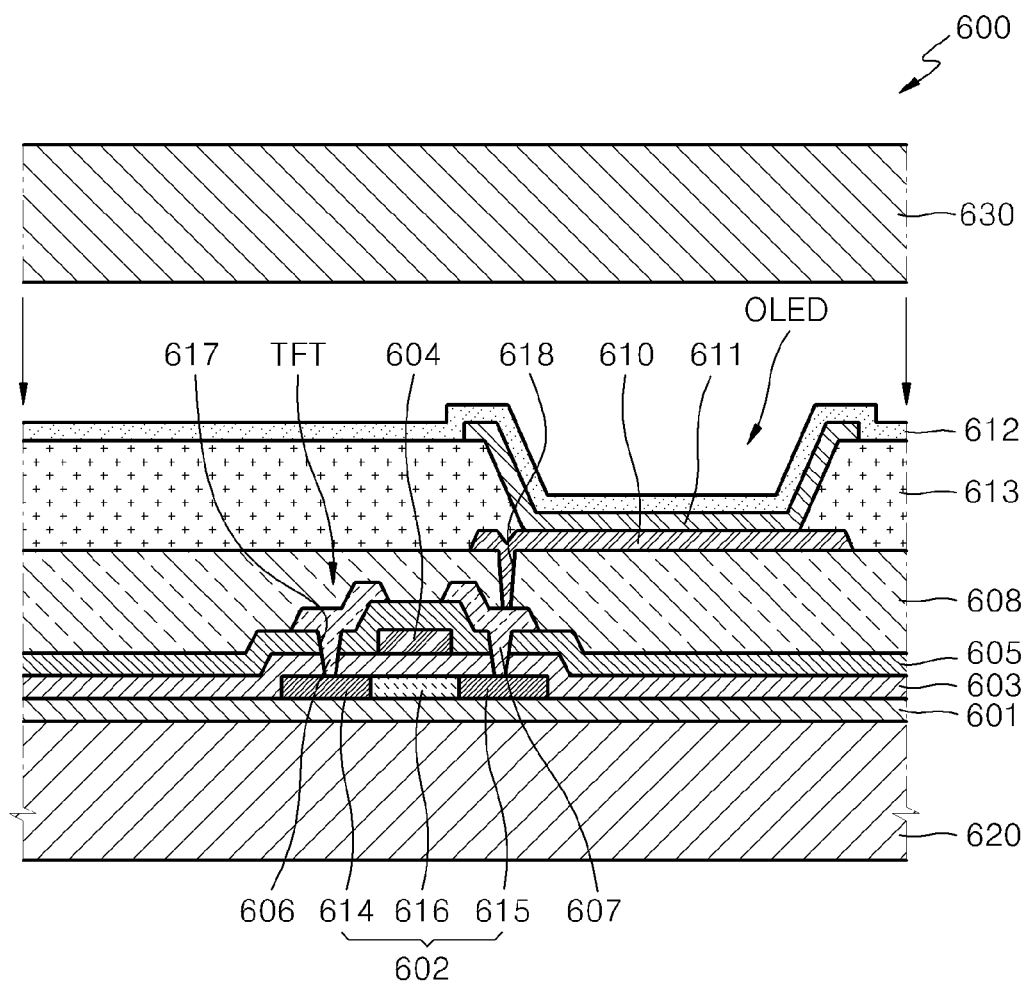
FIG. 6 is a cross-sectional view of a sub-pixel of a display device fabricated using a sputtering system, according to exemplary embodiments.

FIG. 6 is a cross-sectional view of a sub-pixel of a display device 600 fabricated using, for example, a sputtering system, according to exemplary embodiments. For descriptive convenience, the sub-pixel of the display device 600 is described in association with an organic light-emitting display device 600 implementation fabricated utilizing the sputtering system 100 of FIG. 1. It is contemplated, however, that the sputtering system may be utilized to manufacture any suitable component (e.g., layer) on any suitable underlying material, which may be part of any suitable device, such as an electronic device.

According to exemplary embodiments, the illustrated sub-pixel is representative of each of the sub-pixels of the organic light-emitting display device 600. It is noted that each sub-pixel may include at least one thin film transistor (TFT) and an organic light-emitting device (OLED). Although the at least one TFT is shown including a particular configuration/structure, it is contemplated that the at least one TFT may have any suitable configuration/structure. For example, the number, configuration, and/or structure of the TFTs may be modified.

In exemplary embodiments, a thin film layer of the organic light-emitting display device 600 may include at least one thin film layer that may be formed using the sputtering system 100, such as a thin film layer provided in the at least one TFT, a plurality of electrodes and an intermediate layer provided as part of the OLED, and an organic or inorganic layer provided as an encapsulation layer covering the OLED. These components are described in more detail in the proceeding paragraphs.

Referring to FIG. 6, a barrier layer 601 may be formed on a substrate 620. The barrier layer 601 may be formed of any suitable material, such as, for example, an inorganic material, e.g., silicon oxide ($SiO_x$), silicon nitride ($SiN_x$), silicon oxynitride (SiON), aluminum oxide (AlO), aluminum nitride (AlON), etc., an organic material, e.g., acrylic, polyimide, polyester, etc., or a combination thereof. Alternatively, one or more organic materials may be stacked on one or more inorganic materials, such as in an alternative fashion, or vice versa. In exemplary embodiments, the barrier layer 601 may block contaminants, e.g., oxygen, moisture, dust, debris, etc., from affecting one or more components of the organic light emitting display device 600. That is, the barrier layer 601 may prevent moisture, impurities, etc., from being diffused through the substrate 620. It is noted that the barrier may also provide a planarized surface on the substrate 620.

The TFT may be formed on the barrier layer 601. Although a top gate-type TFT is exemplified in FIG. 6, any suitable TFT with any suitable structure may be utilized, such as, for example, a bottom gate-type TFT, etc. The TFT may include a semiconductor active layer 602 formed on the barrier layer 601. The semiconductor active layer 602 may include any suitable pattern of one or more materials and/or geometric configurations of the one or more materials. When the semiconductor active layer 602 is formed of polysilicon, the polysilicon may be formed by forming amorphous silicon and crystallizing the amorphous silicon to form polysilicon. It is noted, however, that any other suitable process may be utilized.

The amorphous silicon may be crystallized via any suitable method, such as, for example, a rapid thermal annealing (RTA) method, a solid phase crystallization (SPC) method, an eximer laser annealing (ELA) method, an metal-induced crystallization (MIC) method, a metal-induced lateral crystallization (MILC) method, a sequential lateral solidification (SLS) method, and/or the like. In exemplary embodiments, a high-temperature annealing process may or may not be utilized to crystallize the amorphous silicon. For example, when the amorphous silicon is crystallized by using a low-temperature polysilicon (LTPS) process, the semiconductor active layer 602 may be irradiated using a laser for a time to activate the semiconductor active layer 602. In this manner, the time in which the substrate 620 is exposed to a high temperature may be reduced (or prevented), and the process may be performed at or below 300° C.

The semiconductor active layer 602 may be doped with N-type or P-type impurity ions to form a source region 614 and a drain region 615. A channel region 616 that is not doped with impurities may be formed between the source region 614 and the drain region 615. It is noted that the semiconductor active layer 602 may be alternatively formed of one or more oxide materials. For example, an oxide semiconductor may include an oxide of Groups 12, 13, and/or 14, such as zinc (Zn), indium (In), gallium (Ga), tin (Sn), germanium (Ge), hafnium (Hf), etc., and combinations thereof.

A gate insulating layer 603 may be deposited on the semiconductor active layer 602. The gate insulating layer 603 may include a single layer formed of any suitable material, such as, for example, $SiO_2$ or a multilayer structure (e.g., double layer structure) formed of, for instance, $SiO_x$ and $SiN_x$. A gate electrode 604 may be formed on a region of the gate insulating layer 603. The gate electrode 604 may be connected to a gate line (not shown) through which a gate (e.g., on/off) signal may be applied. The gate electrode 604 may be formed of a single metal or multiple metals. For example, the gate electrode 604 may be a single or multilayer structure formed from one or more of gold (Au), silver (Ag), copper (Cu), nickel (Ni), neodymium (Nd), platinum (Pt), palladium (Pd), aluminum (Al), molybdenum (Mo), chromium (Cr), tungsten (W), etc., or an alloy formed of at least two of the aforementioned materials, such as Al:Nd or Mo:W. The gate electrode 604 may be formed of various conductive materials in consideration of adhesion, planarization, electric resistance, processability, etc.

An interlayer insulating layer 605 may be formed on the gate electrode 604. The interlayer insulating layer 605 may be formed of any suitable insulting material, such as, for instance, $SiO_x$, $SiN_x$, etc. The interlayer insulating layer 605 may be additionally or alternatively formed of an insulative organic material.

A source electrode 606 and a drain electrode 607 may be formed on the interlayer insulating layer 605. That is, a portion of the gate insulating layer 603 and the interlayer insulating layer 605 may be selectively removed to form contact holes 617 and 618. In this manner, formation of the source electrode 606 may occur such that the source electrode 606 is electrically connected to the source region 614 via contact hole 617. Formation of the drain electrode 607 may occur such that the drain electrode 607 is electrically connected to the drain region 615 via the contact hole 618. Each of the source electrode 606 and the drain electrode 607 may be formed of Au, Pd, Pt, Ni, rhodium (Rh), ruthenium (Ru), iridium (Ir), osmium (Os), Al, Mo, etc., or an alloy formed of at least two of the aforementioned materials, such as an Al:Nd alloy, an Mo:W alloy, etc. It is contemplated, however, that any suitable conductive material may be utilized to form the source electrode 606 and the drain electrode 607.

According to exemplary embodiments, a protection layer (e.g., a passivation layer and/or a planarization layer) 608 may be formed to cover the source electrode 606 and the drain electrode 607. The protection layer 608 may protect the TFT and may be provided to planarize the substrate 620 including the TFT formed thereon. The protection layer 608 may be formed of any suitable material including any suitable structure/configuration. For example, the protection layer 608 may be formed of an organic material, such as benzocyclobutene (BCB) or acryl, or an inorganic material, such as $SiN_x$. Also, the protection layer 608 may be a single layer structure, or a multilayer structure.

In exemplary embodiments, an OLED may be formed on the TFT, e.g., formed on the protection layer 608. It is noted, however, that any suitable display device may be formed in association with exemplary embodiments described herein, and, therefore, the configuration may be modified in any suitable manner. As shown, the OLED may include a first electrode 610 corresponding to, for instance, a pixel electrode formed on the protection layer 608. The first electrode 610 may be electrically connected to one of the source electrode 606 and the drain electrode 607 via the contact hole 618. The first electrode 610 may function as an anode electrode of electrodes provided as part of the OLED. The first electrode 610 may be formed of various conductive materials, such as one or more of the aforementioned materials. It is also contemplated that the first electrode 610 may be formed as transparent electrode or a reflective electrode, and, thereby, may include any suitable material or combination of materials.

For example, when the first electrode 610 is formed as a transparent electrode, the first electrode 610 may be formed of aluminum zinc oxide (AZO), gallium zinc oxide (GZO), indium tin oxide (ITO), indium zinc oxide (IZO), zinc oxide (ZnO), indium oxide ($In_xO_y$), and the like. It is also contemplated that one or more conductive polymers (ICP) may be utilized, such as, for example, polyaniline, poly(3,4-ethylenedioxythiophene) poly(styrenesulfonate) (PEDOT:PSS), etc. When the first electrode 610 is formed as a reflective electrode, the first electrode 610 may be fabricated by forming a reflective layer using Ag, magnesium (Mg), Al, Pt, lead (Pd), Au, Ni, Nd, Ir, Cr, etc., or any compound thereof, and doping the reflective layer with, for instance, one or more of AZO, GZO, ITO, IZO, ZnO, $In_xO_y$, etc.

A pixel-defining layer 613, formed of, for instance, an organic material, may be formed on the protection layer 608 and may cover one or more edges of the first electrode 610. An intermediate layer 611 may be formed on a portion of the first electrode 610 exposed through an etched portion of the pixel-defining layer 613. The intermediate layer 611 may be formed of any suitable low molecular or high molecular organic material.

When the intermediate layer 611 is formed of a low molecular organic material, a hole injection layer (HIL), a hole transport layer (HTL), an emissive layer (EML), an electron transport layer (ETL), an electron injection layer (EIL), and the like, may be stacked in a single or complex structure. The low molecular organic material may be formed via one or more vacuum deposition processes using one or more masks. When the intermediate layer 611 is formed of a high molecular organic material, the intermediate layer 611 may include an HTL and an EML. The high molecular organic material may be formed via one or more screen printing and/or ink-jet printing processes. It is contemplated, however, that the intermediate layer 611 may include any suitable material and/or configuration.

According to exemplary embodiments, a second electrode 612 corresponding to, for instance, a common electrode of the OLED, may be formed on the intermediate layer 611 and the pixel defining layer 613. It is noted that the first and second electrodes 610 and 612 may be insulated from each other by the intermediate layer 611. When voltage is applied to the first and second electrodes 610 and 612, visible rays may be emitted from the intermediate layer 611, which may be utilized to display an image to an observer.

Similar to the first electrode 610, the second electrode 612 may be formed as a transparent electrode or a reflective electrode. When the second electrode 612 is formed as a transparent electrode, a material having a low work function, such as lithium (Li), calcium (Ca), lithium fluoride (LiF)/Ca, LiF/Al, Al, Ag, Mg, etc., or any suitable compound thereof may be deposited on the intermediate layer 611. In addition, an electrode formed of a transparent electrode material, such as AZO, GZO, ITO, IZO, ZnO, $In_xO_y$, ICP, etc., may be formed on the resultant material layer to form the second electrode 612. When the second electrode 612 is formed as a reflective electrode, the second electrode 612 may be formed by depositing Li, Ca, LiF/Ca, LiF/Al, Al, Mg, etc., or any suitable compound thereof on a surface (e.g., entire surface) of the pixel defining layer 613 and the intermediate layer 611.

When the first electrode 610 is formed as a transparent electrode or a reflective electrode, the first electrode 610 may have a cross-sectional shape corresponding to that of an opening defining each sub-pixel. The second electrode 612 may be formed by depositing the transparent electrode material or the reflective electrode material on an entire surface of the display device 600 in a "display" region including the sub-pixels.

According to exemplary embodiments, an encapsulation layer 630 may be formed on the substrate 620. The encapsulation layer 630 may protect the intermediate layer 611 and one or more of the other thin film layers from external moisture, oxygen, dust, debris, etc.

The sputtering system and method of fabricating a display device using the same, according to exemplary embodiments, may utilize one or more rotatable targets including one or more arranged magnets to provide a closed loop of electrons, which may constitute a half of one target. As such, abnormal discharge due, at least in part, to asymmetric erosion of the target, the arc, and the reduction in plasma density may be minimized, e.g., prevented or reduced.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A sputtering system, comprising:
a chamber;
a first target disposed in the chamber, the first target comprising a first magnet unit disposed therein;
a second target disposed in the chamber, the second target comprising a second magnet unit disposed therein;
a substrate holder configured to support a substrate in the chamber,
wherein:
the first magnet unit comprises a first magnet longitudinally extending in a first direction and a second magnet substantially parallel to the first magnet, the first magnet disposed between the second magnet and the second target;
the second magnet unit comprises a third magnet and a fourth magnet substantially parallel to the third magnet, the third magnet disposed between the fourth magnet and the first target;
the respective lengths of the first and third magnets are smaller than the respective lengths of the second and fourth magnets;
the first magnet unit and the second magnet unit are configured to generate a magnetic field between the first target and the second target that causes, at least in part, the first target and the second target to function as a single target, the magnetic field comprising a closed-loop annular path that, when viewed in a direction perpendicular to the first direction, extends between the first magnet and the second magnet and between the third magnet and the fourth magnet to surround the first magnet and the third magnet;
the first magnet and the second magnet are disposed in only two rows on the first magnet unit;
the third magnet and the fourth magnet are disposed in only two rows on the second magnet unit; and
the first magnet unit and the second magnet unit are symmetrically arranged about an imaginary axis extending between the first target and the second target.

2. The sputtering system of claim 1, wherein:
the first magnet, the second magnet, the third magnet, and the fourth magnet are symmetrically arranged about the imaginary axis in a north pole, south pole-south pole, north pole (NS-SN) magnetic arrangement.

3. The sputtering system of claim 1, wherein:
the first magnet, the second magnet, the third magnet, and the fourth magnet are symmetrically arranged about the imaginary axis in a south pole, north pole-north pole, south pole (SN-NS) magnetic arrangement.

4. The sputtering system of claim 1, wherein:
the first target and the second target are configured to be biased at substantially the same electric potential to facilitate formation of the closed-loop annular path; and magnetic moments of the first magnet and the second magnet point in substantially the same direction.

5. The sputtering system of claim 1, wherein the first magnet unit and the second magnet unit are tilted towards one another.

6. The sputtering system of claim 1, wherein the first target and second target comprise central axes disposed parallel to one another, the central axes extending in a horizontal direction of the chamber.

7. The sputtering system of claim 1, wherein each of the first target and the second target is cylindrically shaped.

8. The sputtering system of claim 1, wherein each of the first target and the second target are rotatably supported in the chamber.

* * * * *